United States Patent
Wan et al.

(10) Patent No.: US 11,664,229 B2
(45) Date of Patent: May 30, 2023

(54) NITRIDE CAPPING OF TITANIUM MATERIAL TO IMPROVE BARRIER PROPERTIES

(71) Applicant: Applied Materials, Inc., Santa Clara, CA (US)

(72) Inventors: Yiyang Wan, Sunnyvale, CA (US); Takashi Kuratomi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 309 days.

(21) Appl. No.: 17/031,131

(22) Filed: Sep. 24, 2020

(65) Prior Publication Data
US 2022/0093403 A1    Mar. 24, 2022

(51) Int. Cl.
*C23C 8/24*      (2006.01)
*C23C 8/36*      (2006.01)
*C23C 8/80*      (2006.01)
*H01L 21/285*    (2006.01)
*H01J 37/32*     (2006.01)

(52) U.S. Cl.
CPC ........ *H01L 21/28518* (2013.01); *C23C 8/24* (2013.01); *C23C 8/36* (2013.01); *C23C 8/80* (2013.01); *H01J 37/3299* (2013.01); *H01J 37/32449* (2013.01); *H01L 21/28568* (2013.01); *H01J 2237/3321* (2013.01)

(58) Field of Classification Search
CPC ............... C23C 8/80; C23C 8/36; C23C 8/24
See application file for complete search history.

(56) References Cited

U.S. PATENT DOCUMENTS

| | | |
|---|---|---|
| 5,851,364 A | 12/1998 | Fu et al. |
| 7,833,906 B2 | 11/2010 | Knapp et al. |
| 9,478,438 B2 | 10/2016 | Thombare et al. |
| 2002/0017658 A1 | 2/2002 | Tsubouchi et al. |
| 2002/0192396 A1 | 12/2002 | Wang et al. |
| 2006/0127601 A1 | 6/2006 | Murakami et al. |
| 2006/0183327 A1 | 8/2006 | Moon |
| 2008/0145797 A1 | 6/2008 | Verbeke et al. |
| 2016/0322229 A1 | 11/2016 | Ganguli et al. |
| 2017/0178927 A1 | 6/2017 | Biggs et al. |

(Continued)

FOREIGN PATENT DOCUMENTS

| | | | |
|---|---|---|---|
| JP | 2000-277459 A | 10/2000 | |
| KR | 10-2011-0131703 A | 12/2011 | |
| WO | WO-9533865 A1 * | 12/1995 | ............ C23C 16/02 |

OTHER PUBLICATIONS

International Search Report dated Dec. 23, 2021 for Application No. PCT/US2021/049586.

*Primary Examiner* — Jessee R Roe
(74) *Attorney, Agent, or Firm* — Patterson + Sheridan, LLP

(57) ABSTRACT

A method and apparatus for nitride capping of titanium materials via chemical vapor deposition techniques is provided. The method includes forming a titanium nitride layer upon a titanium material layer formed on a substrate. The titanium nitride layer is formed by exposing the titanium material layer to a hydrogen-rich nitrogen-containing plasma followed by exposing the titanium material layer to a nitrogen-rich nitrogen-containing plasma. The titanium nitride layer is then exposed to an argon plasma followed by exposing the titanium nitride layer to a halide soak process.

18 Claims, 4 Drawing Sheets

(56) References Cited

U.S. PATENT DOCUMENTS

| 2018/0158686 A1 | 6/2018 | Gelatos et al. |
| 2020/0111885 A1 | 4/2020 | Lin et al. |
| 2020/0144073 A1 | 5/2020 | Kuratomi et al. |
| 2020/0211852 A1 | 7/2020 | Kuratomi et al. |

\* cited by examiner

NITRIDE CAPPING OF TITANIUM MATERIAL TO IMPROVE BARRIER PROPERTIES

BACKGROUND

Field

Implementations of the present disclosure generally relate to semiconductor substrate processing, and more particularly for nitride capping of titanium materials via chemical vapor deposition techniques.

Description of the Related Art

Semiconductor manufacturing processes often involve deposition of titanium or titanium-containing films. Titanium and titanium silicide (TiSix) films are widely used in semiconductor manufacturing to form ohmic contacts and reduce contact resistance between transistor connections. After deposition of the titanium or titanium silicide film, an air break or oxygen exposure can occur prior to additional processing. Titanium and titanium silicide films are easily oxidized once the film is exposed to air. This oxidation increases the contact resistance of the titanium containing film and this increased contact resistance fails to meet the requirements of next generation technology nodes.

Accordingly, there is a need for improved methods, which provide titanium and titanium silicide films with reduced contact resistance.

SUMMARY

Implementations of the present disclosure generally relate to semiconductor substrate processing, and more particularly for nitride capping of titanium materials via chemical vapor deposition techniques.

In one aspect, a method of forming a nitride capping layer is provided. The method includes forming a titanium nitride layer upon a titanium material layer formed on a substrate. The titanium nitride layer is formed by exposing the titanium material layer to a hydrogen-rich nitrogen-containing plasma followed by exposing the titanium material layer to a nitrogen-rich nitrogen-containing plasma. The titanium nitride layer is then exposed to an argon plasma followed by exposing the titanium nitride layer to a halide soak process.

Implementations can include one or more of the following. The hydrogen-rich nitrogen-containing plasma is formed by flowing hydrogen and nitrogen at a first ratio of a volumetric flow rate of hydrogen to a volumetric flow rate of nitrogen greater than about 1:1. The nitrogen-rich nitrogen containing plasma is formed by flowing hydrogen and nitrogen at a second ratio of a second volumetric flow rate of hydrogen to a second volumetric flow rate of nitrogen less than about 1:1. The hydrogen-rich nitrogen-containing plasma is formed by flowing hydrogen and nitrogen at a first ratio of a volumetric flow rate of hydrogen to a volumetric flow rate of nitrogen from about 4:3 to about 8:1. The nitrogen-rich nitrogen containing plasma is formed by flowing hydrogen and nitrogen at a second ratio of a second volumetric flow rate of hydrogen to a second volumetric flow rate of nitrogen from about 1:8 to about 1:6. The substrate includes a high aspect ratio feature, wherein a silicon surface is disposed at a bottom of the high aspect ratio feature and a dielectric surface is disposed on one or more sidewalls of the high aspect ratio. The titanium material layer is formed on the silicon surface. The titanium material layer includes titanium silicide. The titanium nitride capping layer includes TiSiN.

In another aspect, a method of forming a nitride capping layer is provided. The method includes forming a titanium nitride layer upon a titanium material layer formed on a substrate. Forming the titanium nitride layer includes forming a direct plasma reaction between nitrogen ($N_2$), hydrogen ($H_2$), and argon (Ar) inside a process chamber between a showerhead and the substrate, wherein a first ratio of a volumetric flow rate of hydrogen to a volumetric flow rate of nitrogen is greater than about 1:1. Forming the titanium nitride layer further includes increasing the volumetric flow rate of nitrogen and decreasing the volumetric flow rate of hydrogen, wherein a second ratio of a second volumetric flow rate of hydrogen to a second volumetric flow rate of nitrogen is less than about 1:1 The method further includes exposing the titanium nitride layer to argon plasma. The method further includes exposing the titanium nitride layer to a chlorine soak process.

Implementations can include one or more of the following. Exposing the titanium nitride layer to argon plasma includes stopping the flow of nitrogen and hydrogen. The chlorine soak process is a plasma-free process. Forming the direct plasma reaction includes flowing hydrogen and nitrogen at a first ratio of a volumetric flow rate of hydrogen to a volumetric flow rate of nitrogen from about 4:3 to about 8:1. Increasing the volumetric flow rate further includes flowing hydrogen and nitrogen at a second ratio of a second volumetric flow rate of hydrogen to a second volumetric flow rate of nitrogen from about 1:8 to about 1:6. The substrate includes a high aspect ratio feature, wherein a silicon surface is disposed at a bottom of the high aspect ratio feature and a dielectric surface is disposed on one or more sidewalls of the high aspect ratio. The titanium material layer is formed on the silicon surface. The titanium material layer includes titanium, titanium silicide, or substantially pure titanium.

In yet another aspect, a method of forming a nitride capping layer is provided. The method includes forming a titanium silicon nitride capping layer upon a titanium silicide layer formed on a substrate. Forming the titanium silicon nitride capping layer includes exposing the titanium silicide layer to a hydrogen-rich nitrogen-containing plasma to form a first portion of the titanium silicon nitride capping layer. Forming the titanium silicon nitride capping layer further includes exposing the first portion of the titanium silicon nitride capping layer to a nitrogen-rich nitrogen-containing plasma to form a second portion of the titanium silicon nitride capping layer. The method further includes exposing the titanium silicon nitride capping layer to an argon plasma to form a plasma treated titanium silicon nitride capping layer. The method further includes exposing the plasma treated titanium silicon nitride capping layer to a chlorine soak process to reduce a thickness of the plasma treated silicon nitride capping layer.

Implementations can include one or more of the following. The hydrogen-rich nitrogen-containing plasma is formed by flowing hydrogen and nitrogen at a first ratio of a volumetric flow rate of hydrogen to a volumetric flow rate of nitrogen from about 4:3 to about 8:1. The nitrogen-rich nitrogen containing plasma is formed by flowing hydrogen and nitrogen at a second ratio of a second volumetric flow rate of hydrogen to a second volumetric flow rate of nitrogen from about 1:8 to about 1:6.

In another aspect, a non-transitory computer readable medium has stored thereon instructions, which, when executed by a processor, causes an apparatus to perform operations of the above methods.

BRIEF DESCRIPTION OF THE DRAWINGS

So that the manner in which the above-recited features of the present disclosure can be understood in detail, a more particular description of the implementations, briefly summarized above, can be had by reference to implementations, some of which are illustrated in the appended drawings. It is to be noted, however, that the appended drawings illustrate only typical implementations of this disclosure and are therefore not to be considered limiting of its scope, for the disclosure can admit to other equally effective implementations.

Figure 1:
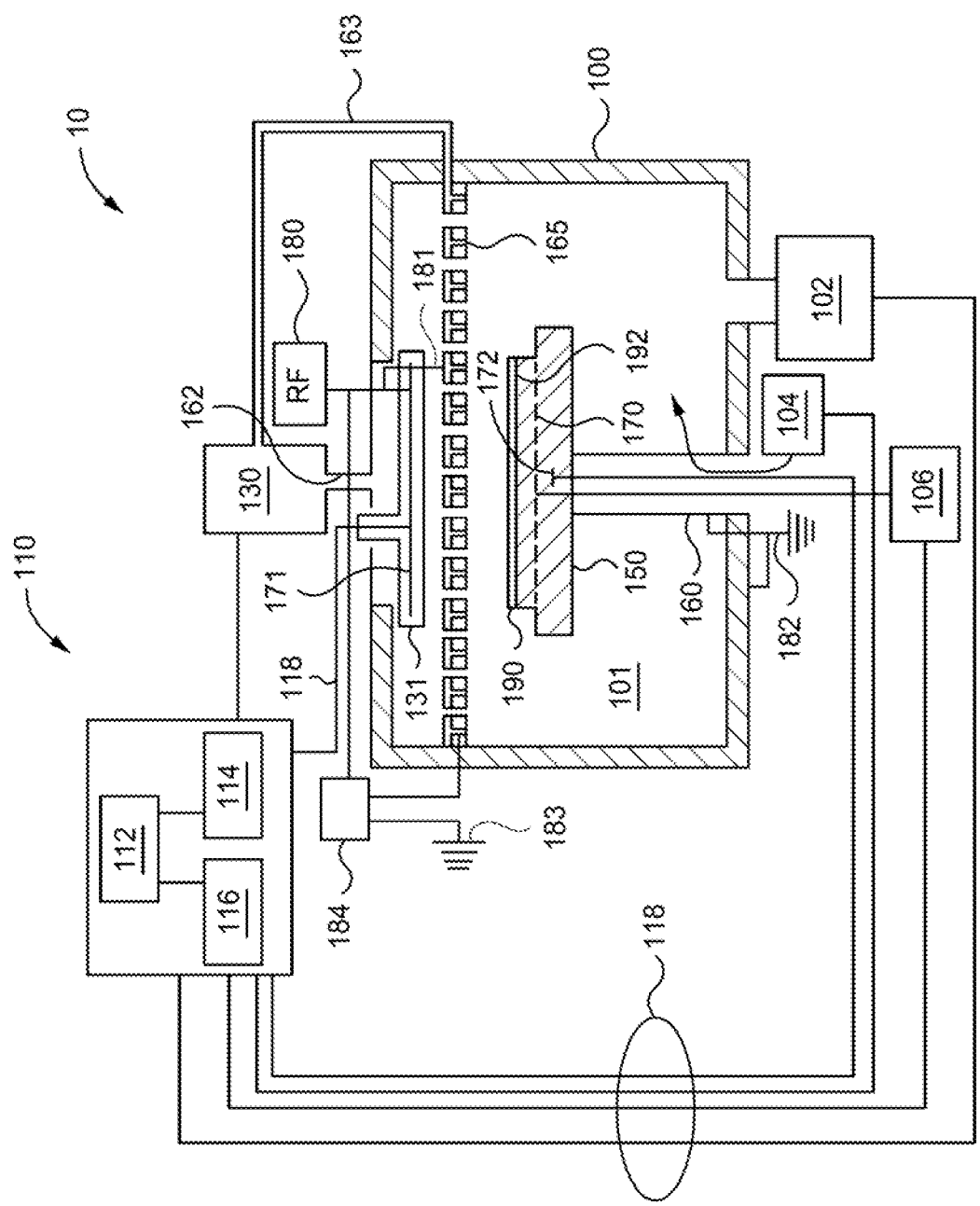
FIG. 1 illustrates a schematic view of an apparatus suitable for practicing the methods of the present disclosure.

To facilitate understanding, identical reference numerals have been used, where possible, to designate identical elements that are common to the figures. It is contemplated that elements and features of one implementation can be beneficially incorporated in other implementations without further recitation.

DETAILED DESCRIPTION

The following disclosure describes nitride capping of titanium materials. Certain details are set forth in the following description and in FIGS. 1-3D to provide a thorough understanding of various implementations of the disclosure. Other details describing well-known structures and systems often associated with chemical vapor deposition and titanium deposition are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations of the present disclosure relate to methods of forming nitride capping layers with improved oxidation barrier properties. Titanium and titanium silicide are easily oxidized once exposed to air. Nitride caps are currently used to protect deposited titanium and titanium silicide films from oxidation. However, currently available nitride caps often fail to minimize oxidation, and hence the contact resistance of the capped titanium films does not meet requirements for the next generation technology node. One or more implementations of the present disclosure advantageously address the issue of resistivity reduction in spite of the need for shrinking nodes by providing methods of forming nitride capping materials with improved barrier properties. In some implementations, the method of the present disclosure includes exposure to a nitrogen-rich gas mixture plasma to improve the nitride concentration in the nitride cap layer. After nitridation, exposure to an inert gas plasma and a halide soak are used to remove unstable titanium and silicon bonds. This removal of unstable bonds is believed to result in lower oxidation of the underlying titanium material after exposure to air. Due to the lower oxidation, the contact resistance of the formed integrated circuit device can be lower.

FIG. 1 is a schematic illustration of an apparatus such as a substrate processing system 10 suitable for practicing the methods of the present disclosure. In embodiments, the substrate processing system 10 includes a process chamber 100, a control unit 110, a gas panel 130, along with other hardware components such as power supplies and vacuum pumps. Exemplary process chambers can include any of several process chambers configured for remote and direct chemical vapor deposition (CVD) reactions as described herein, available from Applied Materials, Inc. of Santa Clara, Calif. Other suitable process chambers from other manufacturers can similarly be used and modified in accordance with the present disclosure.

In embodiments, the process chamber 100 generally includes a lid heater 131, which is used to heat a processing volume 101 including a region such as a plenum space between the lid heater 131 and a showerhead 165 within the process chamber 100. Depending on the specific process, the processing volume 101 in a region between the lid heater 131 and the showerhead 165 can be heated to some targeted temperature prior to and during processing in accordance with the present disclosure. In embodiments, the lid heater 131 is heated by an embedded heating element such as a heating element 171. For example, the lid heater 131 can be resistively heated by applying an electric current from an AC supply (not shown) to the heating element 171. The processing volume 101 region between the lid heater 131 and the showerhead 165 is, in turn, heated by the lid heater 131, and can be maintained within a process temperature range of, for example, 200 to 800 degrees Celsius, or at a first temperature of about 550 degrees Celsius. In some embodiments, the region between the lid heater 131 and the showerhead 165 of the process chamber 100 is maintained at a first temperature of 200 to 800 degrees Celsius. In some embodiments, a lid heater at a temperature of 200 to 800 degrees Celsius or in some embodiments about 550 degrees Celsius, a showerhead at about 500 degrees Celsius (heated by radiant heat from the lid heater), a wafer temperature of about 425 degrees Celsius, and a pedestal heated to about 450 degrees Celsius can heat the region between the lid heater 131 and the showerhead 165 to a temperature of 200 to 800 degrees Celsius or in some embodiments, about 550 degrees Celsius. In embodiments, the region between the lid heater 131 and the showerhead 165 is characterized as a plenum space.

In embodiments, a temperature sensor (not shown), such as a thermocouple, can be embedded in the lid heater 131 to monitor the temperature of the lid heater 131. For example, the measured temperature can be used in a feedback loop to control the power supply for the lid heater 131 such that the processing volume 101 temperature in a region between the lid heater 131 and the showerhead 165 can be maintained or controlled at a targeted temperature that is suitable for the particular process application. In embodiments, the lid heater 131 is configured to provide heat sufficient to promote remote plasma formation in the processing volume 101 between the lid heater 131 and the showerhead 165, or within the showerhead 165 and prevent condensation within or upon the showerhead 165. For example, the control unit 110 can be in communication with the lid heater 131 so that a user can adjust the heat of the lid heater 131 and maintain a heat sufficient for remote plasma formation. In embodiments, depending upon processing needs, the lid heater 131 is configured not to heat, or promote remote plasma formation in the processing volume 101 in a region between the lid heater 131 and the showerhead 165. For example, the lid heater 131 can be switched off by way of the control unit 110 depending upon user needs.

In embodiments, a radio frequency electrode 181 can be embedded in the lid heater 131 to configure the lid heater 131 for providing radio frequency in an amount sufficient to form a plasma adjacent the lid heater 131. In embodiments, the lid heater 131 is configured to provide RF sufficient to promote plasma formation in the processing volume 101 in a region between the lid heater 131 and the showerhead 165, and/or within the showerhead 165. For example, the control unit 110 can be in communication with the lid heater 131 so that a user can adjust the RF emitted from the lid heater 131 and maintain an RF signal sufficient for plasma formation. In embodiments, depending upon processing needs, the lid heater 131 is configured not to emit an RF signal or promote plasma formation in the processing volume 101 between the lid heater 131 and the showerhead 165. For example, the lid heater 131 can be switched off by way of the control unit 110 depending upon user needs eliminating RF generated therefrom.

In embodiments, the process chamber 100 generally includes a support pedestal 150, which has a support surface 192 used to support a substrate such as a substrate 190, which can be a semiconductor substrate, within the process chamber 100. The support pedestal 150 is coupled with a pedestal stem 160, which can be moved in a vertical direction inside the process chamber 100 using a displacement mechanism (not shown). Depending on the specific process, the substrate 190 can be heated to some targeted temperature prior to processing. In embodiments, the support pedestal 150 is heated by an embedded heating element such as the heating element 170. For example, the support pedestal 150 can be resistively heated by applying an electric current from an AC supply 106 to the heating element 170. The substrate 190 is, in turn, heated by the support pedestal 150, and can be maintained within a process temperature range of, for example, 200 to 800 degrees Celsius or 300 to 700 degrees Celsius. In embodiments, a temperature sensor 172, such as a thermocouple, can be embedded in the support pedestal 150 to monitor the temperature of the support pedestal 150 in a conventional manner. For example, the measured temperature can be used in a feedback loop to control the power supply such as the AC supply 106 for the heating element 170 such that the substrate 190 temperature can be maintained or controlled at a targeted temperature that is suitable for the particular process application. In embodiments, the support pedestal includes a ground at 182.

In embodiments, proper control and regulation of gas flows through the process chamber 100 and the gas panel 130 is performed by mass flow controllers (not shown) and the control unit 110 such as a computer. The showerhead 165 allows process gases from the gas panel 130 to be uniformly distributed and introduced into the process chamber 100. In embodiments, the showerhead 165 is configured for flowing reaction products (such as reaction products suitable for forming a titanium material layer such as titanium or titanium silicide and a nitride capping layer as described herein) into the process chamber to form a nitride capping layer, for example TiN or TiSiN) upon a titanium material layer formed upon the silicon surface of the substrate.

Illustratively, the control unit 110 includes a central processing unit (CPU) 112, support circuitry 114, and memories containing associated control software 116. The control unit 110 is responsible for automated control of the numerous operations for processing the substrate 190 such as wafer transport, gas flow control, temperature control, chamber evacuation, and so on. Bi-directional communications between the control unit 110 and the various components of the substrate processing system 10 are handled through numerous signal cables collectively referred to as signal buses 118, some of which are illustrated in FIG. 1.

In some embodiments, the present disclosure relates to a non-transitory computer readable medium, such as memory, having instructions stored thereon that, when executed, cause a method of selectively depositing a nitride capping layer upon a titanium material layer formed upon a substrate having a silicon surface and a dielectric surface, including: forming a plasma reaction between nitrogen ($N_2$), hydrogen ($H_2$) and argon (Ar) in a region between a lid heater and a showerhead of a process chamber at a first temperature of 200 to 800 degrees Celsius; and flowing reaction products into the process chamber to selectively form a nitride capping layer upon a titanium material layer formed upon the silicon surface of the substrate 190.

In some embodiments, the radio frequency electrode 181 can be embedded in the showerhead 165 to configure the showerhead 165 for providing RF energy in an amount sufficient to form a plasma adjacent the showerhead 165. In embodiments, the showerhead 165 is configured to provide RF sufficient to promote plasma formation in the processing volume 101. For example, the control unit 110 can be in communication with the showerhead 165 so that a user can adjust RF emitted from the showerhead 165 and maintain an RF signal sufficient for plasma formation. In embodiments, the showerhead 165 can optionally be grounded by a ground 183 depending upon user needs for plasma placement within the processing volume 101. In embodiments, where the showerhead 165 is grounded, a remote plasma can form in a region between the lid heater 131 and the showerhead 165 in the processing volume 101. In embodiments, where the showerhead 165 is not grounded, a direct plasma is formed in a region between the showerhead 165 and the substrate 190 in the processing volume 101. A switch 184 can be in communication with the ground 183 and the RF electrode 180 and the showerhead 165 and configured to control remote and direct plasma formation in accordance with the present disclosure and depending upon user needs. In embodiments, the switch 184 and the showerhead 165 are in communication and configured to control remote and direct plasma formation in accordance with the present disclosure and depending upon user needs. In some embodiments, a power supply such as an RF or VHF power supply, is electrically coupled to the chamber lid via the switch 184 when the switch is disposed in a first position. When the switch 184 is disposed in a second position (not shown) the power supply is electrically coupled to the showerhead 165. When the switch 184 is in the first position, the power supply is used to ignite and maintain a first plasma which is remote from the substrate 190, such as a remote plasma disposed in the plenum space or region directly between the lid heater and showerhead. In some embodiments, a remote plasma is composed of the processing gases flowed into the plenum and maintained as a plasma by capacitive coupling of power from the power supply. In some embodiments, when the switch 184 is in a second position, the power supply is used to ignite and maintain a second plasma (not shown) in the processing volume 101 between the showerhead 165 and the substrate 190 disposed on the support pedestal 150.

In embodiments, process chamber 100 includes a vacuum pump 102 to evacuate the process chamber 100 and to maintain the proper gas flows and pressure inside the process chamber 100. The showerhead 165, through which process gases are introduced into the process chamber 100, is located above the support pedestal 150. In embodiments, the showerhead 165 can be configured as a multiple gas showerhead having two or more separate pathways, which allow two or more gases to be separately introduced into the process chamber 100 without premixing. In some embodiments, the showerhead 165 is connected to the gas panel 130 which controls and supplies, through mass flow controllers (not shown), various gases used in different steps of the processing sequence. During wafer processing, a purge gas supply 104 also provides a purge gas, for example, an inert gas, around the bottom of the support pedestal 150 to minimize undesirable deposits from forming on the support pedestal 150.

In embodiments, the control unit 110 is responsible for controlling gas flow from the gas panel 130 to the processing volume 101 such as a region between lid heater 131 and showerhead 165 by a first gas flow line 162, or within showerhead 165 by a second gas flow line 163. In some embodiments, process chamber 100 is configured such that gas panel 130 provides nitrogen ($N_2$), hydrogen ($H_2$) and/or argon (Ar) or a halide-containing gas inside the process chamber 100 and the processing volume 101. For example, in embodiments, the processing volume 101 is configured to receive nitrogen ($N_2$) at about 1,000 to 6,000 sccm. In embodiments, the processing volume 101 is configured to receive hydrogen ($H_2$) at about 1,000 to 6,000 sccm. In embodiments, the processing volume 101 is configured to receive about 6,000 sccm of argon. In some embodiments, one or more gases can be directed from the gas panel 130 into the processing volume 101 via the second gas flow line 163. For example, in embodiments, hydrogen ($H_2$), or noble gas such as argon (Ar) gas can be added to the processing volume 101 by the second gas flow line 163. In some embodiments, such as where the process chamber 100 is configured for remote plasma application, e.g., igniting plasma in a region between the lid heater 131 and the showerhead 165, or within the showerhead 165, one or more gases such as nitrogen ($N_2$), hydrogen ($H_2$) and/or argon (Ar) can be directed from the gas panel 130 into the processing volume 101 via the first gas flow line 162, and one or more gases such as nitrogen ($N_2$), or hydrogen ($H_2$), or argon (Ar) gases can be directed to the processing volume 101 by the second gas flow line 163.

In embodiments, the volumetric flow rate, temperature, and pressure of the processing volume 101 can be adjusted to a value sufficient for a reaction in accordance with the present disclosure. In some embodiments, such as where the process chamber 100 is configured for direct plasma application, for example, igniting plasma in a region between the showerhead 165 and the substrate 190, one or more gases such as nitrogen ($N_2$), hydrogen ($H_2$) and/or argon (Ar) can be directed from the gas panel 130 into the processing volume 101 via the first gas flow line 162, and one or more gases such as nitrogen ($N_2$), hydrogen ($H_2$) and/or argon (Ar) can be directed to the processing volume 101 by the second gas flow line 163. In embodiments, the volumetric flow rate, temperature, and pressure of the processing volume 101 can be adjusted to a value sufficient for a reaction in accordance with the present disclosure.

In embodiments, the process chamber 100 includes the RF electrode 180 sufficient for igniting plasma within the processing volume 101 in accordance with the present disclosure. In embodiments, the RF electrode 180 can be coupled to one or more power sources (one power source not shown) through one or more respective matching networks (matching network shown). The one or more power sources can be capable of producing up to 3,000 watts of RF energy at a frequency of about 350 kHz to about 60 MHz, such as at about 350 kHz, or about 13.56 MHz, or about 60 Mhz. In embodiments, about 200 watts to about 600 watts of RF energy is applied to the remote plasma reaction within the processing volume 101. In some embodiments, RF energy is about 300 watts to about 600 watts or about 500 watts. In some embodiments, pulsed RF energy or RF in a continuous wave mode is applied. In some embodiments, the RF power is about 500 watts, with a pulsed frequency of about 1 kHz, and a duty cycle about 50%. In some embodiments, the process chamber 100 can utilize capacitively coupled RF energy for plasma processing. For example, the process chamber 100 can have a ceiling made from dielectric materials and the showerhead 165 is at least partially conductive to provide an RF electrode (or a separate RF electrode can be provided). The showerhead 165 (or other RF electrode) can be coupled to one or more RF power sources (one RF power source not shown) through one or more respective matching networks (matching network not shown). The one or more plasma sources can be capable of producing up to about 3,000 watts, or in some embodiments, up to about 5,000 watts, of RF energy.

Figure 2:
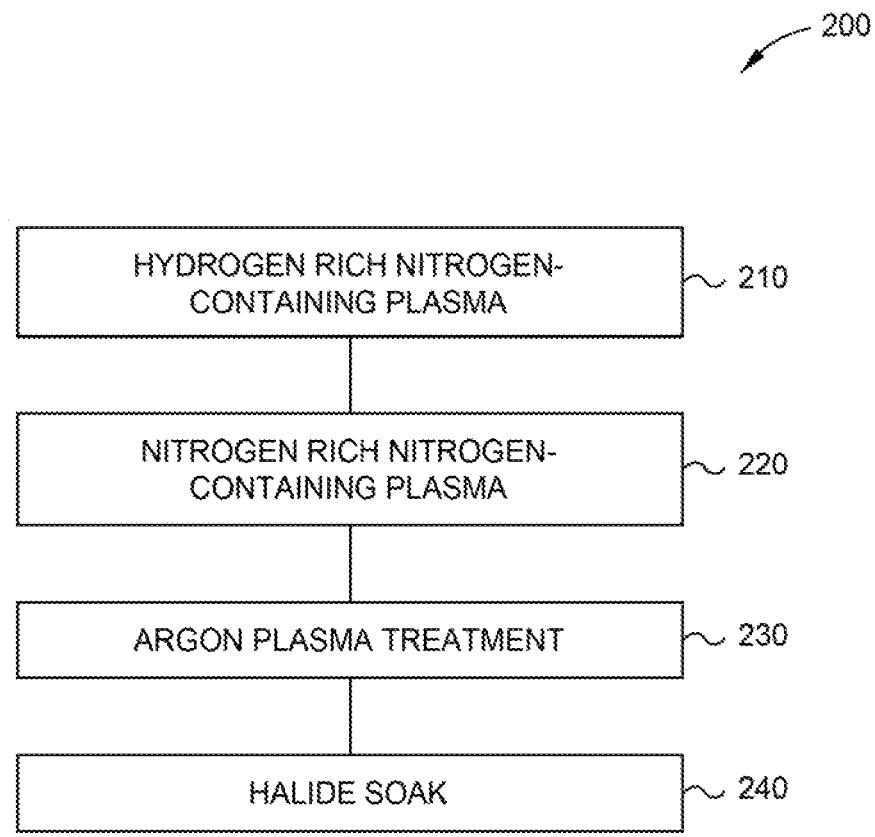
FIG. 2 illustrates a flowchart of a processing sequence of nitride capping in accordance with one or more embodiments of the present disclosure.

FIG. 2 illustrates a flowchart of a method 200 of nitride capping in accordance with one or more embodiments of the present disclosure. FIGS. 3A-3D illustrate schematic cross-sectional views of a substrate during different stages of the method 200 of FIG. 2 in accordance with one or more implementations of the present disclosure. The methods of the present disclosure can be performed in process chambers configured for thermal deposition techniques, for example, chemical vapor deposition (CVD), such as the process chamber 100 discussed above with respect to FIG. 1.

Figure 3A:
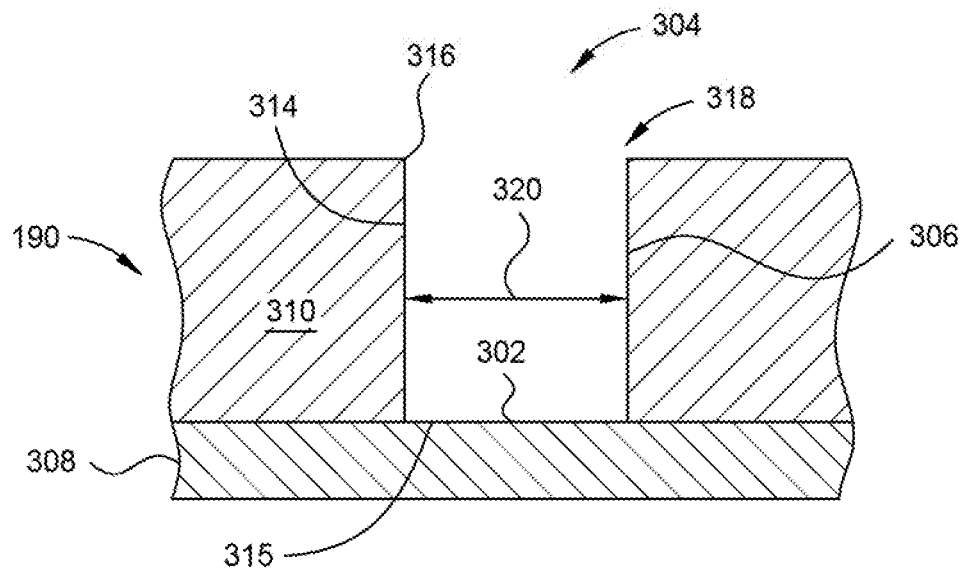
FIGS. 3A-3D illustrate schematic cross-sectional views of a substrate during different stages of the processing sequence of FIG. 2 in accordance with one or more implementations of the present disclosure.

In embodiments, the method 200 is performed on a substrate 190, as depicted in FIG. 3A, having a silicon surface 302 extending across a bottom surface 315 of a feature 304 and one or more dielectric surfaces such as dielectric surface 306. In embodiments, substrate 190 can include a silicon material 308 such as crystalline silicon (e.g., Si<100> or Si<111>), silicon germanium, doped or undoped polysilicon, doped or undoped silicon wafers, patterned or non-patterned wafers, silicon on insulator (SOI), or a combination thereof. In embodiments, a silicon material 308 can comprise or consist of a material such as crystalline silicon (e.g., Si<100> or Si<111>), pure silicon, substantially pure silicon (having less than 1%, or less than 0.5% impurities), or exposed silicon, such as a pretreated silicon with a native oxide layer removed. In embodiments, the substrate 190 may have various dimensions, such as 200 mm, 300 mm, 450 mm or other diameters for round substrates. The substrate 190 may also be any polygonal, square, rectangular, curved or otherwise non-circular workpiece, such as a polygonal glass substrate used in the fabrication of flat panel displays. Unless otherwise noted, implementations and examples described herein are conducted on substrates such as the substrate 190 with, for example, a 200 mm diameter, a 300 mm diameter, or a 450 mm diameter substrate.

In some embodiments, the silicon material 308 is deposited via any suitable atomic layer deposition process or a chemical layer deposition process. In some embodiments, the silicon material 308 can include any suitable silicon material for semiconductor device fabrication. Referring to FIG. 3A, a silicon oxide layer (not shown) may be atop the silicon surface 302. The silicon oxide layer may be a native oxide layer or form as the silicon surface 302 contacts oxygen, for example in air or water. In some embodiments, the silicon oxide layer can be problematic in that the silicon oxide layer may be less selective towards titanium materials than an exposed silicon surface. In some embodiments, the method 200 can include, pre-treating the silicon surface 302 to form an exposed silicon surface. In some embodiments, the method 200 includes contacting the silicon surface 302 with one or more etchants to expose the silicon surface 302. In some embodiments, a silicon oxide layer is removed prior to depositing a titanium material atop, or directly atop the silicon surface 302 to expose the silicon surface 302. Non-limiting examples of exposed silicon surface materials include substantially pure, for example, substantially free of oxide, silicon and the like.

In embodiments, the dielectric layer 310 includes the one or more features 304 such as a via or trench formed in the dielectric layer 310. The one or more features 304 may be formed by etching the dielectric layer 310 using any suitable etch process. In some embodiments, the one or more features 304 is defined by one or more sidewalls 314, the bottom surface 315, an opening 318 and upper corners 316. In some embodiments, the one or more features 304 can have a high aspect ratio, for example, an aspect ratio between about of about 5:1 and about 20:1. As used herein, the aspect ratio is the ratio of a depth of the feature to a width of the feature. In embodiments, the one or more features 304 has a width 320 less than or equal to about 20 nanometers, less than or equal to about 10 nanometers, or a width 320 from about 5 to about 10 nanometers.

In embodiments, the dielectric layer 310 including the dielectric surface 306 is not the same as the silicon material 308 including the silicon surface 302. In some embodiments, the dielectric layer 310 is deposited via any suitable atomic layer deposition process or a chemical layer deposition process. In some embodiments, the dielectric layer 310 can include a low-k dielectric layer deposited atop the silicon material 308. In some embodiments, the dielectric layer 310 can include any low-k dielectric material suitable for semiconductor device fabrication. Non-limiting materials suitable as low-k dielectric material can include a silicon-containing material, for example, such as silicon oxide ($SiO_2$), silicon nitride, silicon oxynitride (SiON), a combination thereof, or combinations of layers thereof. In embodiments, the low-k dielectric material may have a low-k value of less than about 3.9 (for example, about 2.5 to about 3.5). In some embodiments, the dielectric layer 310 can include hafnium oxide such as HfOx. In embodiments, the dielectric layer 310 and the dielectric surface 306 comprise or consist of silicon oxide ($SiO_2$), silicon nitride, silicon oxynitride (SiON), or a combination thereof.

In some embodiments, the substrate 190 can be pretreated in order to enhance the selectivity of the exposed silicon surface 302 relative to the dielectric layer 310. In one example, the dielectric layer 310 is pretreated by contacting the dielectric layer 310 with silane alone or in combination with a noble gas such as argon.

Figure 3B:
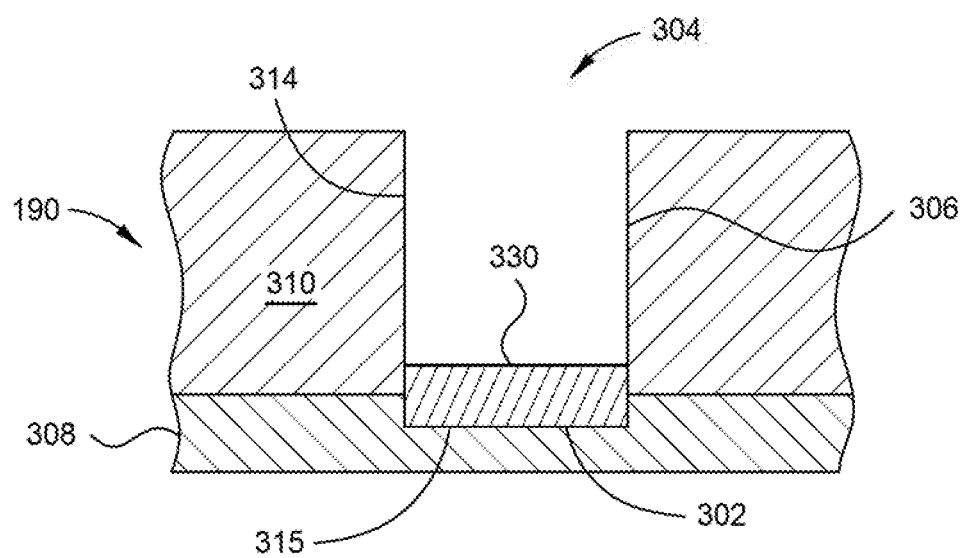

Referring to FIG. 3B, a titanium material layer 330 is selectively formed atop or within the exposed silicon surface 302. The titanium material layer 330 includes or consists of titanium, titanium silicide (TiSix), or substantially pure titanium. In some embodiments, the titanium silicide or TiSix refers to titanium silicide, where x is a number between 0.4 and 2.2. In some embodiments, TiSix refers to one or more of $Ti_5Si_3$, $TiSi_2$, TiSi, or a combination thereof.

The titanium material layer 330 can be deposited by any suitable technique including, but not limited to, PVD, CVD, and ALD processes. In one example, the titanium material layer 330 is formed by a plasma reaction between titanium tetrachloride ($TiCl_4$), hydrogen ($H_2$), and argon (Ar) and due to atom migration, titanium and silicon atoms migrate to form TiSix. The wafer temperature can be maintained during the plasma reaction at a temperature of about 200 to 800 degrees Celsius such as about 450 degrees Celsius. The thickness of the titanium material layer 330 can be in the range of about 20 Å to about 400 Å, or in the range of about 30 Å to about 300 Å, or in the range of about 40 Å to about 250 Å, or in the range of about 50 Å to about 200 Å, or about 100 Å. In some embodiments, a titanium silicide film having a thickness of about 100 Å is deposited by CVD.

In some embodiments, prior to performing the method 200, the substrate 190 is exposed to a pretreatment process to remove any residues remaining from formation of the titanium material layer 330, for example, $TiCl_4$ residues. In one example, the pretreatment process includes exposing the substrate 190 to a remotely formed hydrogen plasma. Exposure to the hydrogen plasma process can occur for a time in the range of about 5 seconds to about 20 seconds, for example, about 10 seconds to about 15 seconds. During the pretreatment process, the wafer temperature can be maintained at a temperature of about 200 to 800 degrees Celsius such as about 450 degrees Celsius. In another example, the pretreatment process includes preheating the substrate by contacting the substrate with hydrogen and argon at a temperature above room temperature (such as a temperature of 200 to 800 degrees Celsius) while contacting the substrate with argon and silane.

Figure 3C:
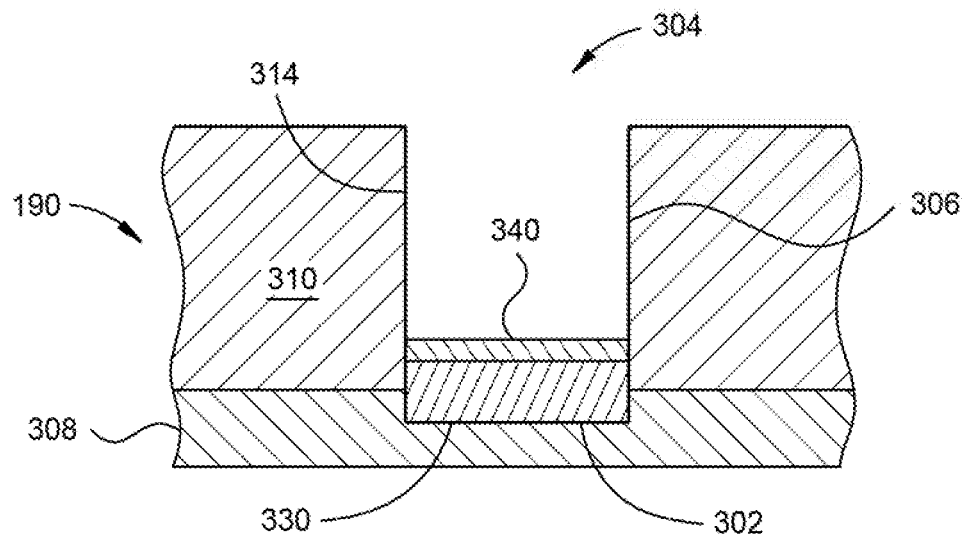

In embodiments, the method 200 includes operation 210, where the titanium material layer 330 is exposed to a hydrogen-rich nitrogen-containing plasma to form at least a first portion of a titanium nitride capping layer 340 upon or within the titanium material layer 330 atop the silicon surface 302 of the substrate 190 as shown in FIG. 3C. The titanium nitride capping layer 340 can be a TiN capping layer or a TiSiN capping layer. As used herein, "hydrogen-rich" refers to a ratio where a volumetric flow rate of hydrogen is greater than a volumetric flow rate of nitrogen, for example, a volumetric flow rate of hydrogen to a volumetric flow rate of nitrogen is greater than about 1:1. In some embodiments, operation 210 includes forming a direct plasma reaction between nitrogen ($N_2$), hydrogen ($H_2$) and argon (Ar) inside a process chamber (such as process chamber 100 in FIG. 1) between the showerhead (such as the showerhead 165 in FIG. 1) and the substrate 190 to form the titanium nitride capping layer 340. In some embodiments, a direct plasma nitrogen and hydrogen reaction is provided to form titanium nitride capping layer 340. In some embodiments, the direct plasma reaction is performed subsequent to post-treating the titanium material layer 330 as described above. In some embodiments, hydrogen is included in the direct plasma reaction in an amount of 4 to 8 standard liters per minute (slpm) or about 6 slpm. In some embodiments, nitrogen is provided to the direct plasma reaction in an amount of 0.5 to 2 slpm, or about 1 slpm. In embodiments, argon is provided to the direct plasma reaction in an amount of 4 to 8 standard liters per minute (slpm) or about 6 slpm. In embodiments, the process chamber during the direct plasma reaction has a pressure of about 1 to 8 Torr, such as 4 Torr. In embodiments, RF power is applied during the direct plasma reaction at about 500 watts. In some embodiments, the wafer temperature is maintained during the direct plasma reaction at a temperature of about 200 to 800 degrees Celsius such as about 425 degrees Celsius. In some embodiments, the lid heater is heated during the direct plasma reaction to a temperature of about 200 to 800 degrees Celsius such as about 550 degrees Celsius. In some embodiments, a pedestal temperature during the direct plasma reaction is maintained at a temperature of about 200 to 800 degrees Celsius, or about 450 degrees Celsius.

In some embodiments, the nitridation processing sequence or the direct plasma reaction provides nitrogen at a volumetric flow rate of about 0.5 to 2 slpm, and hydrogen in an amount of 0.1 slpm to 6 slpm. In embodiments, the pressure of the process chamber during the direct plasma reaction is maintained at 1 Torr to 8 Torr. In embodiments, RF power is applied during the direct plasma reaction at about 100 watts to 1000 watts.

In embodiments, a ratio of a volumetric flow rate of hydrogen to a volumetric flow rate of nitrogen during operation 210 is greater than about 1:1, 4:3, 5:2, 6:1, or 8:1. In one example, a ratio of a volumetric flow rate of hydrogen to a volumetric flow rate of nitrogen during operation 210 is from about 4:3 to about 8:1, for example, from about 4:3 to about 6:1, such as from about 5:2 to about 6:1.

Exposure to the hydrogen-rich nitrogen-containing plasma process can occur for a time in the range of about 30 seconds to about 90 seconds. In some embodiments, exposure to the hydrogen-rich nitrogen-containing plasma process occurs for a time in the range of about 30 seconds to about 70 seconds, or about 40 seconds to about 60 seconds, or about 50 seconds. In some embodiments, exposure to the hydrogen-rich nitrogen-containing plasma process occurs for greater than or equal to about 35 seconds, 40 seconds, 50 seconds, 60 seconds, 70 seconds or 80 seconds. In some embodiments, exposure to the hydrogen-rich nitrogen-containing plasma process occurs for less than or equal to about 90 seconds, or 80 seconds, or 70 seconds, or 60 seconds, or 50 seconds, or 40 seconds.

The thickness of the initial titanium nitride capping layer 340 can be in the range of about 20 Å to about 30 Å, for example, from about 20 Å to about 25 Å, such as from about 20 Å to about 22 Å.

In embodiments, the method 200 further includes operation 220, where the titanium nitride capping layer 340 is exposed to a nitrogen-rich nitrogen-containing plasma to form a portion of the titanium nitride capping layer 340. Not to be bound by theory but it is believed that the nitrogen-rich nitrogen-containing plasma of operation 220 increases the oxidation resistivity of the deposited titanium nitride capping layer 340. As used herein, "nitrogen-rich" refers to a ratio where a volumetric flow rate of hydrogen is less than a volumetric flow rate of nitrogen, for example, a volumetric flow rate of hydrogen to a volumetric flow rate of nitrogen is less than about 1:1. In some embodiments, the nitrogen-rich nitrogen-containing plasma can be achieved by increasing the flow rate of nitrogen and decreasing the flow rate of hydrogen from operation 210. In some embodiments, operation 220 includes forming a direct plasma reaction between nitrogen ($N_2$), hydrogen ($H_2$) and argon (Ar) inside a process chamber (such as process chamber 100 in FIG. 1) between the showerhead (such as the showerhead 165 in FIG. 1) and the substrate 190 to form at least a portion of the titanium nitride capping layer 340. In some embodiments, a direct plasma nitrogen and hydrogen reaction is provided to form the portion of the titanium nitride capping layer 340. In some embodiments, the direct plasma reaction is performed subsequent to operation 210. In some embodiments, nitrogen is included in the direct plasma reaction in an amount of 4 to 8 standard liters per minute (slpm) or about 6 slpm. In some embodiments, hydrogen is provided to the direct plasma reaction in an amount of 0.5 to 2 slpm, or about 1 slpm. In embodiments, argon is provided to the direct plasma reaction in an amount of 4 to 8 standard liters per minute (slpm) or about 6 slpm. In embodiments, the process chamber during the direct plasma reaction has a pressure of about 1 to 8 Torr, such as 4 Torr. In embodiments, RF power is applied during the direct plasma reaction at about 500 watts. In some embodiments, the wafer temperature is maintained during the direct plasma reaction at a temperature of 200 to 800 degrees Celsius such as about 425 degrees Celsius. In some embodiments, the lid heater is heated during the direct plasma reaction to a temperature of 200 to 800 degrees Celsius such as about 550 degrees Celsius. In some embodiments, a pedestal temperature during the direct plasma reaction is maintained at a temperature of 200 to 800 degrees Celsius, or about 450 degrees Celsius.

In some embodiments, the nitrogen-rich plasma processing sequence or the direct plasma reaction provides hydrogen at a volumetric flow rate of about 0.5 to 2 slpm and nitrogen in an amount of 0.1 slpm to 6 slpm. In embodiments, the pressure of the process chamber during the direct plasma reaction of operation 220 is maintained at 1 Torr to 8 Torr. In embodiments, RF power during operation 220 is applied during the direct plasma reaction at about 100 watts to 1000 watts.

In embodiments, a ratio of a volumetric flow rate of hydrogen to a volumetric flow rate of nitrogen during operation 220 is less than about 1:1, 3:4, 1:2, 2:5, 1:6, 1:8, or 1:10. In one example, a ratio of a volumetric flow rate of hydrogen to a volumetric flow rate of nitrogen during operation 220 is from about 1:10 to about 2:5, for example, from about 1:8 to about 1:6, such as about 1:6.

Exposure to the nitrogen-rich nitrogen-containing plasma process can occur for a time in the range of about 10 seconds to about 70 seconds. In some embodiments, exposure to the nitrogen-rich nitrogen-containing plasma process occurs for a time in the range of about 10 seconds to about 50 seconds, or about 20 seconds to about 40 seconds, or about 35 seconds. In some embodiments, exposure to the nitrogen-rich nitrogen-containing plasma process occurs for greater than or equal to about 15 seconds, 20 seconds, 30 seconds, 40 seconds, 50 seconds or 60 seconds. In some embodiments, exposure to the soak process occurs for less than or equal to about 70 seconds, or 60 seconds, or 50 seconds, or 40 seconds, or 30 seconds, or 20 seconds.

The thickness of the titanium nitride capping layer 340 can increase during operation 220 relative to the thickness of the titanium nitride layer after operation 210. The thickness of the titanium nitride capping layer 340 after operation 220 can be in the range of about 25 Å to about 35 Å, for example, from about 25 Å to about 30 Å, such as from about 25 Å to about 27 Å.

In embodiments, the method 200 further includes operation 230, where the formed titanium nitride capping layer 340 is exposed to an argon plasma treatment. Not to be bound by theory but it is believed that the argon plasma treatment of operation 230 removes unstable bonds and densifies the formed titanium nitride capping layer 340. In some embodiments, exposure to the argon plasma treatment can be achieved by stopping the flow rate of nitrogen and the flow rate of hydrogen from operation 220 while continuing the flow of argon and maintaining the process conditions from operation 220. In some embodiments, operation 230 includes forming a direct plasma of argon inside a process chamber (such as process chamber 100 in FIG. 1) between the showerhead (such as the showerhead 165 in FIG. 1) and the substrate 190 to treat the titanium nitride capping layer 340. In other embodiments, the argon plasma is formed remotely and delivered to the process chamber. In some embodiments, the argon plasma treatment of operation 230 is performed subsequent to operation 220. In embodiments, argon is provided to the direct plasma in an amount of 4 to 8 standard liters per minute (slpm) or about 6 slpm. In embodiments, the process chamber during exposure to the argon plasma treatment has a pressure of about 1 to 8 Torr, such as 4 Torr. In embodiments, RF power is applied during the argon plasma treatment at about 500 watts. In some embodiments, the wafer temperature is maintained during exposure to the argon plasma treatment at a temperature of 200 to 800 degrees Celsius such as about 425 degrees Celsius. In some embodiments, the lid heater is heated during exposure to the argon plasma treatment to a temperature of 200 to 800 degrees Celsius such as about 550 degrees Celsius. In some embodiments, a pedestal temperature during exposure to the argon plasma treatment is maintained at a temperature of 200 to 800 degrees Celsius, or about 450 degrees Celsius.

In some embodiments, the argon plasma treatment of operation 230 provides argon at a volumetric flow rate of about 4 to 8 slpm, for example, from about 4 slpm to about 6 slpm. In embodiments, the pressure of the process chamber during operation 230 is maintained at 1 Torr to 8 Torr. In embodiments, RF power during operation 230 is applied at about 100 watts to 1000 watts.

Exposure to the argon plasma treatment can occur for a time in the range of about 5 seconds to about 60 seconds. In some embodiments, argon plasma exposure occurs for a time in the range of about 5 seconds to about 20 seconds, or about 5 seconds to about 15 seconds, or about 10 seconds. In some embodiments, plasma exposure occurs for greater than or equal to about 5 seconds, 10 seconds, 20 seconds, 30 seconds, 40 seconds or 50 seconds. In some embodiments, plasma exposure occurs for less than or equal to about 60 seconds, or 50 seconds, or 40 seconds, or 30 seconds, or 20 seconds, or 10 seconds.

In some implementations, a purge can be performed after the argon plasma treatment of operation 230. In a purge operation, argon plasma species and effluents are removed from the process chamber. This can be done by purging and/or evacuating the process chamber to remove any remaining argon plasma species. The species generated in the argon plasma can be removed by stopping the plasma and allowing argon to continue to flow to purge and/or evacuate the process chamber.

In embodiments, the method 200 further includes operation 240, where the formed titanium nitride capping layer 340 is treated with a soak process with a halide-containing precursor. Not to be bound by theory but it is believed that the halide soak process removes unstable bonds, such as unstable titanium bonds, and reduces the thickness of the titanium nitride capping layer 340. The halide precursor can be a chlorine-containing precursor or a fluorine-containing precursor. In one example the halide-containing precursor is chlorine. The halide-containing precursor can be flowed in with a carrier gas, such as a helium gas (He), an argon gas (Ar), nitrogen gas ($N_2$), other suitable gases, or a combination thereof. In some embodiments, exposure to the soak can be achieved by flowing chlorine into the process chamber while maintaining the flow rate of argon from operation 230 and maintaining the process conditions from operation 230 without the application of RF power. In some embodiments, the soak of operation 240 is performed subsequent to operation 230. In embodiments, argon is provided to the process chamber in an amount of 4 to 8 standard liters per minute (slpm) or about 6 slpm. In embodiments, the halide precursor (e.g., $Cl_2$) is provided to the process chamber in an amount of 50 sccm to about 500 sccm or about 100 sccm. In embodiments, the process chamber during exposure to the halide soak process has a pressure of about 1 to 8 Torr, such as 4 Torr. In embodiments, the soak process is a plasma-free process. In some embodiments, the wafer temperature is maintained during the soak process at a temperature of 200 to 800 degrees Celsius such as about 425 degrees Celsius. In some embodiments, the lid heater is heated during the soak process to a temperature of 200 to 800 degrees Celsius such as about 550 degrees Celsius. In some embodiments, a pedestal temperature during exposure to the soak process is maintained at a temperature of 200 to 800 degrees Celsius, or about 450 degrees Celsius.

In some embodiments, the soak process provides chlorine at a volumetric flow rate of about 50 to 200 sccm and argon in an amount of 0.1 slpm to 6 slpm. In embodiments, the pressure of the process chamber during the soak process of operation 240 is maintained at 1 Torr to 8 Torr.

Exposure to the soak process can occur for a time in the range of about 5 seconds to about 60 seconds. In some embodiments, exposure to the soak process occurs for a time in the range of about 5 seconds to about 20 seconds, or about 5 seconds to about 15 seconds, or about 10 seconds. In some embodiments, exposure to the soak process occurs for greater than or equal to about 5 seconds, 10 seconds, 20 seconds, 30 seconds, 40 seconds or 50 seconds. In some embodiments, exposure to the soak process occurs for less than or equal to about 60 seconds, or 50 seconds, or 40 seconds, or 30 seconds, or 20 seconds, or 10 seconds.

The thickness of the titanium nitride capping layer 340 can decrease during operation 240 relative to the thickness of the titanium nitride layer after operation 220. The thickness of the titanium nitride capping layer 340 after operation 240 can be in the range of about 22 Å to about 32 Å, for example, from about 22 Å to about 27 Å, such as from about 23 Å to about 25 Å.

It has been found that the exposure to the argon plasma treatment of operation 230 and the halide soak of operation 240 can reduce the oxygen content of the titanium nitride capping layer 340. As used herein, a reduced oxygen content can mean that the oxygen content was reduced from the oxygen concentration of the titanium nitride capping layer 340 to have an oxygen content less than or equal to about 14 atomic %, 13.7 atomic %, 13.5 atomic %, or 13 atomic %.

Figure 3D:
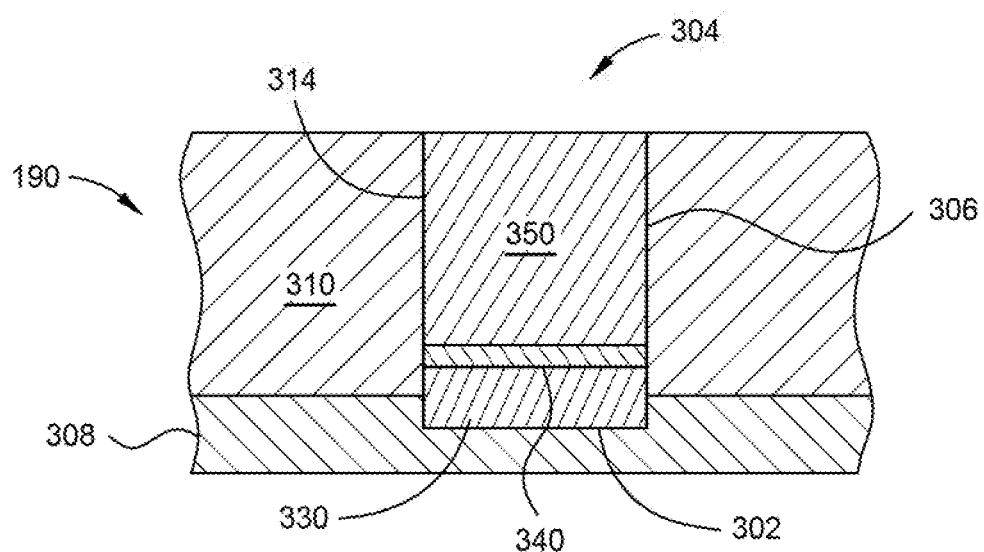

In some embodiments, after operation 240, the method 200 further includes filling the feature 304 with a metal fill 350 such as cobalt or tungsten as shown in FIG. 3D.

EXAMPLES

The following non-limiting examples are provided to further illustrate implementations described herein. However, the examples are not intended to be all inclusive and are not intended to limit the scope of the implementations described herein.

A silicon substrate having a TiSix layer formed thereon was provided. For operation 210, the TiSi layer was exposed to a hydrogen-rich nitrogen-containing plasma as described herein for 50 seconds to form an initial TiSiN capping layer on the TiSi layer. For operation 220, the initial TiSiN capping layer was exposed to a nitrogen-rich nitrogen-containing plasma as described herein for 35 seconds. The TiSiN capping layer was then exposed to an argon plasma treatment for a period of 10 seconds followed by a chlorine soak for a period of 10 seconds.

The oxygen content of the deposited capping film was determined by X-ray photoelectron spectroscopy (XPS) and the results are shown in Table 1.

TABLE 1

|  | Thickness (Å) | [Si] % | [Ti] % | [N] % | [Cl] % | [O] % |
| --- | --- | --- | --- | --- | --- | --- |
| After Operation 210 | 21.8 | 13.5 | 27.7 | 38.3 | 1.3 | 19.3 |
| After Operation 220 | 26.7 | 14.7 | 24.3 | 39.8 | 0.8 | 16.3 |
| After Operations 230 and 240 | 24.7 | 17.3 | 23.4 | 44.2 | 1.1 | 13.7 |

It was observed that the argon plasma treatment followed by chlorine soak decreased both the thickness and the oxygen content of the final TiSiN capping layer.

Implementations can include one or more of the following potential advantages. One or more implementations of the present disclosure advantageously address the issue of resistivity reduction in spite of the need for shrinking nodes by providing methods of forming nitride capping materials with improved barrier properties. In some implementations, the method of the present disclosure includes exposure to a nitrogen-rich gas mixture plasma to improve the nitride concentration in the nitride cap layer. After nitridation, exposure to an inert gas plasma and a halide soak are used to remove unstable titanium and silicon bonds. This removal of unstable bonds is believed to result in lower oxidation of the underlying titanium material after exposure to air. Due to the lower oxidation, the contact resistance of the formed integrated circuit device can be lower.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there can be additional elements other than the listed elements.

While the foregoing is directed to embodiments of the present disclosure, other and further embodiments of the disclosure can be devised without departing from the basic scope thereof, and the scope thereof is determined by the claims that follow.

The invention claimed is:

1. A method of forming a nitride capping layer, comprising:
    forming a titanium nitride layer upon a titanium material layer formed on a substrate, comprising:
        exposing the titanium material layer to a hydrogen-rich nitrogen-containing plasma; and
        exposing the titanium material layer to a nitrogen-rich nitrogen-containing plasma;
    exposing the titanium nitride layer to an argon plasma; and
    exposing the titanium nitride layer to a halide soak process,
    wherein the substrate comprises a high aspect ratio feature, wherein a silicon surface is disposed at a bottom of the high aspect ratio feature and a dielectric surface is disposed on one or more sidewalls of the high aspect ratio feature.

2. The method of claim 1, wherein the hydrogen-rich nitrogen-containing plasma is formed by flowing hydrogen and nitrogen at a first ratio of a volumetric flow rate of hydrogen to a volumetric flow rate of nitrogen greater than about 1:1.

3. The method of claim 2, wherein the nitrogen-rich nitrogen-containing plasma is formed by flowing hydrogen and nitrogen at a second ratio of a second volumetric flow rate of hydrogen to a second volumetric flow rate of nitrogen less than about 1:1.

4. The method of claim 1, wherein the hydrogen-rich nitrogen-containing plasma is formed by flowing hydrogen and nitrogen at a first ratio of a volumetric flow rate of hydrogen to a volumetric flow rate of nitrogen from about 4:3 to about 8:1.

5. The method of claim 4, wherein the nitrogen-rich nitrogen-containing plasma is formed by flowing hydrogen and nitrogen at a second ratio of a second volumetric flow rate of hydrogen to a second volumetric flow rate of nitrogen from about 1:8 to about 1:6.

6. The method of claim 1, wherein the titanium material layer is formed on the silicon surface.

7. The method of claim 1, wherein the titanium material layer comprises titanium silicide.

8. The method of claim 7, wherein the titanium nitride layer comprises TiSiN.

9. A method of forming a nitride capping layer, comprising:
forming a titanium nitride layer upon a titanium material layer formed on a substrate, comprising:
forming a direct plasma reaction between nitrogen ($N_2$), hydrogen ($H_2$), and argon (Ar) inside a process chamber between a showerhead and the substrate, wherein a first ratio of a volumetric flow rate of hydrogen to a volumetric flow rate of nitrogen is greater than about 1:1;
increasing the volumetric flow rate of nitrogen and decreasing the volumetric flow rate of hydrogen, wherein a second ratio of a second volumetric flow rate of hydrogen to a second volumetric flow rate of nitrogen is less than about 1:1;
exposing the titanium nitride layer to argon plasma, wherein exposing the titanium nitride layer to argon plasma comprises stopping the flow of nitrogen and hydrogen; and
exposing the titanium nitride layer to a chlorine soak process.

10. The method of claim 9, wherein the chlorine soak process is a plasma-free process.

11. The method of claim 9, wherein the first ratio of the volumetric flow rate of hydrogen to the volumetric flow rate of nitrogen is from about 4:3 to about 8:1.

12. The method of claim 11, wherein the second ratio of the second volumetric flow rate of hydrogen to the second volumetric flow rate of nitrogen is from about 1:8 to about 1:6.

13. The method of claim 9, wherein the substrate comprises a high aspect ratio feature, wherein a silicon surface is disposed at a bottom of the high aspect ratio feature and a dielectric surface is disposed on one or more sidewalls of the high aspect ratio feature.

14. The method of claim 13, wherein the titanium material layer is formed on the silicon surface.

15. The method of claim 14, wherein the titanium material layer comprises titanium, titanium silicide, or substantially pure titanium.

16. A method of forming a nitride capping layer, comprising:
forming a titanium silicon nitride capping layer upon a titanium silicide layer formed on a substrate, comprising:
exposing the titanium silicide layer to a hydrogen-rich nitrogen-containing plasma to form a first portion of the titanium silicon nitride capping layer; and
exposing the first portion of the titanium silicon nitride capping layer to a nitrogen-rich nitrogen-containing plasma to form a second portion of the titanium silicon nitride capping layer;
exposing the titanium silicon nitride capping layer to an argon plasma to form a plasma treated titanium silicon nitride capping layer; and
exposing the plasma treated titanium silicon nitride capping layer to a chlorine soak process to reduce a thickness of the plasma treated titanium silicon nitride capping layer.

17. The method of claim 16, wherein the hydrogen-rich nitrogen-containing plasma is formed by flowing hydrogen and nitrogen at a first ratio of a volumetric flow rate of hydrogen to a volumetric flow rate of nitrogen from about 4:3 to about 8:1.

18. The method of claim 17, wherein the nitrogen-rich nitrogen-containing plasma is formed by flowing hydrogen and nitrogen at a second ratio of a second volumetric flow rate of hydrogen to a second volumetric flow rate of nitrogen from about 1:8 to about 1:6.

* * * * *